(12) United States Patent
Lee et al.

(10) Patent No.: US 8,748,061 B2
(45) Date of Patent: Jun. 10, 2014

(54) METHOD OF FABRICATING WAVE-SHAPED MASK FOR PHOTOLITHOGRAPHY AND EXPOSURE METHOD OF FABRICATING NANO-SCALED STRUCTURE USING THE WAVE-SHAPED MASK

(75) Inventors: Si-Chen Lee, Taipei (TW); Fang-Tzu Chuang, Taipei (TW); Yu-Wei Jiang, New Taipei (TW)

(73) Assignee: National Taiwan University, Taipei (TW)

( * ) Notice: Subject to any disclaimer, the term of this patent is extended or adjusted under 35 U.S.C. 154(b) by 67 days.

(21) Appl. No.: 13/424,119

(22) Filed: Mar. 19, 2012

(65) Prior Publication Data
US 2013/0065162 A1 Mar. 14, 2013

(30) Foreign Application Priority Data
Sep. 13, 2011 (TW) .............................. 100132878 A

(51) Int. Cl.
*G03F 1/00* (2012.01)
(52) U.S. Cl.
USPC ............................................................ 430/5

(58) Field of Classification Search
USPC ................................................ 430/5, 311, 322
See application file for complete search history.

(56) References Cited

U.S. PATENT DOCUMENTS

| 7,491,892 B2 * | 2/2009 | Wagner et al. ................. 174/254 |
| 2008/0233489 A1 * | 9/2008 | Blanchet et al. ................... 430/5 |
| 2010/0015535 A1 * | 1/2010 | Song et al. ......................... 430/5 |

* cited by examiner

*Primary Examiner* — Stewart Fraser
(74) *Attorney, Agent, or Firm* — Huffman Law Group, P.C.

(57) ABSTRACT

A method of fabricating wave-shaped mask is disclosed. The method of fabricating wave-shaped mask comprises the steps of providing an elastomeric transparent substrate comprising an upper surface and a lower surface, applying a stable force to the elastomeric transparent substrate for deforming the elastomeric transparent substrate, forming a light-penetrable thin film layer on the upper surface of the elastomeric transparent substrate, and removing the force applying to the elastomeric transparent substrate, whereby the upper surface of the elastomeric transparent substrate and the light-penetrable thin film layer are in a periodic wave shape and the lower surface of the elastomeric transparent substrate is in a plate shape.

14 Claims, 8 Drawing Sheets

METHOD OF FABRICATING WAVE-SHAPED MASK FOR PHOTOLITHOGRAPHY AND EXPOSURE METHOD OF FABRICATING NANO-SCALED STRUCTURE USING THE WAVE-SHAPED MASK

CROSS-REFERENCE TO RELATED APPLICATIONS

This application claims priority of Taiwan Patent Application No. 100132878, filed on Sep. 13, 2011, the disclosure of which is hereby incorporated by reference in its entirety.

BACKGROUND

Because of rising device densities, increased speeds of devices, and attempts to reduce power consumption by continuously miniaturizing integrated circuit processes, the semiconductor industry has reached the generation of nano-scaled devices by degree. Recently, the research and invention of nano material has become a subject to which much importance has been attached. Based on the effect of nano scale, some scholars have devoted their research to investigate the properties of various materials in nano scale such that nano-scaled structures in different dimensions, such as nano dots, nano wires, nano tubes, nano pillars, nano rings, nano rods, and nano films, are prepared widely to study associated characteristics.

Although materials in nano scale have special physical and chemical properties, they may be affected relatively easily by an external force. As a result, preparing a large area of nano-scaled structures of precisely the same size is a challenge needed to be overcome for research of the properties of nano-scaled structures. Many process technologies of various nano scales, such as ultra-low wavelength developing technology, dipping high-refractive-index liquid interference developing technology, e-beam developing technology, and nano imprint technology, have developed for manufacturing nano-period structures.

However, these technologies are costly and the processes capable of producing very small size patterns in nano-period structure are time consuming. Therefore, there is a need for technology to provide a process for fabricating large areas of nano-structured patterns.

SUMMARY

The present application describes a method of fabricating a wave-shaped mask and an exposure method using the wave-shaped mask.

In an embodiment, the method of fabricating the wave-shaped mask comprises the steps of providing an elastomeric transparent substrate. The elastomeric transparent substrate has an upper surface and a lower surface, applying a stable force to the elastomeric transparent substrate to deform the elastomeric transparent substrate, forming a light-penetrable thin film layer on the upper surface of the elastomeric transparent substrate, and removing the force applying to the elastomeric transparent substrate, whereby the upper surface of the elastomeric transparent substrate and the light-penetrable thin film layer are in periodic wave shape and the lower surface of the elastomeric transparent substrate is in plate shape.

In another embodiment, the exposure method of fabricating nano-scaled structure using the wave-shaped mask comprises the steps of providing a sample substrate. The upper surface of the sample substrate is coated with a photoresist layer, placing the wave-shaped surface of the wave-shaped mask in contact with the photoresist layer, and exposing the plate-shaped surface of the wave-shape mask to a light source, whereby the photoresist layer is patterned to be a nano-period structure pattern.

The advantages of the fabrication method of the wave-shaped mask for photolithography are simple and rapid. The cost and time consumed for manufacturing the large-area pattern can be reduced significantly.

The foregoing is a summary and shall not be construed to limit the scope of the claims. The operations and devices disclosed herein may be implemented in a number of ways, and such changes and modifications may be made without departing from this invention and its broader aspects. Other aspects, inventive features, and advantages of the invention, as defined solely by the claims, are described in the non-limiting detailed description set forth below.

DETAILED DESCRIPTION

Figure 1A:
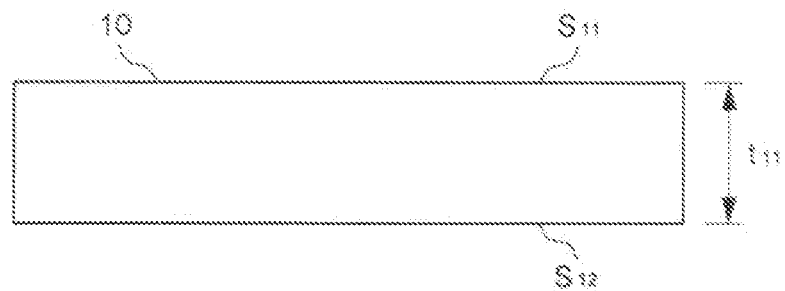
FIGS. 1A through 1D are cross sectional views illustrating the steps for fabricating a wave-shaped mask, in accordance with an embodiment of the present disclosure.

The following description is of the best-contemplated modes of carrying out the invention. These descriptions are made for the purpose of illustrating the general principles of the invention and should not be taken in a limiting sense. The scope of the invention is best determined by reference to the appended claims.

Reference will be made in detail to the present embodiments, examples of which are illustrated in the accompanying drawings. Wherever possible, the same reference numbers are used in the drawings and the description to refer to the same or like parts. In the drawings, the shape and thickness of one embodiment may be exaggerated for clarity and convenience. This description will be directed in particular to elements forming part of, or cooperating more directly with, apparatus in accordance with the present invention. It is to be understood that elements not specifically shown or described may take various forms well known to those skilled in the art. Further, when a layer is referred to as being on another layer or "on" a substrate, it may be directly on the other layer or on the substrate, or intervening layers may also be present.

The present application describes structures of a wave-shaped mask and methods of fabricating the wave-shaped mask for photolithography. FIGS. 1A through 1D are cross sectional views illustrating the steps for fabricating a wave-shaped mask. It is worthy to note that the fabrication method for the wave-shaped mask of the present invention may comprise other components, but in order to simplify the figures and descriptions, only the basic and/or essential structures are depicted and described, such depictions and descriptions not being restrictive of the scope of the present invention.

Referring to FIG. 1A, first, an elastomeric transparent substrate 10 is provided. The elastomeric transparent substrate 10 is preferably a rectangular plate having an upper surface $S_{11}$ and a lower surface $S_{12}$. The distance between the upper surface $S_{11}$ and the lower surface $S_{12}$ is regarded as thickness $t_{11}$ of the elastomeric transparent substrate 10. For example, the thickness $t_{11}$ is approximately 0.5 to 10 mm and the width and length of the elastomeric transparent substrate 10 are about 0.5 to 30 cm and 1 to 60 cm, respectively. The material of the elastomeric transparent substrate 10 may be a transparent polymeric elastomer comprising Polydimethylsiloxane (PDMS), Polyimide (PI), etc.

Figure 1B:
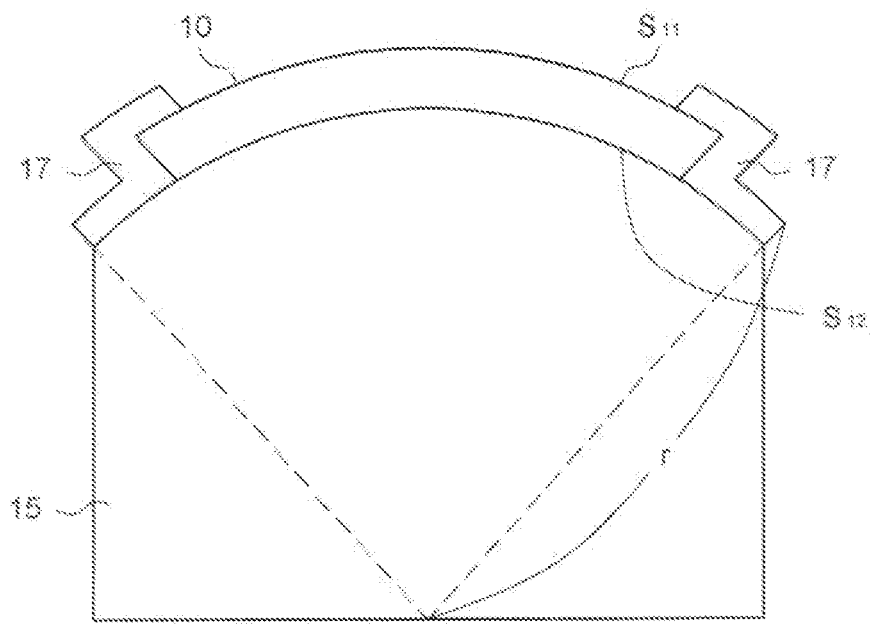

As shown in FIG. 1B, a stage device 15 is provided. The stage device 15 is preferably a cylinder which has an arc-shaped edge with a curvature 1/r on the top of the stage device 15, where r is the radius of curvature of the arc-shaped edge. In practice, the arc-shaped edge is in circular arc or non-circular arc shape. Then, the elastomeric transparent substrate 10 is placed on the stage device 15 such that the elastomeric transparent substrate 10 is bent into an arc shape. Consequently, the curvature of the upper surface $S_{11}$ and the lower surface $S_{12}$ of the elastomeric transparent substrate 10 is similar to the curvature 1/r of the top of the stage device 15.

In an embodiment, the stage device 15 may be disposed in a machine (not shown). The elastomeric transparent substrate 10 may be placed on the stage device 15 in a near vacuum condition of the machine. Specifically, the two ends of the elastomeric transparent substrate 10 may be fixed on the stage device 15 via a fastening element 17. The fastening element 17 may be part of the stage device 15, and may comprise adhesive tape, etc. for securing the opposite shorter side of the elastomeric transparent substrate 10 to the stage device 15 and applying a stable force to the elastomeric transparent substrate 10. Hence, the elastomeric transparent substrate 10 may remain in the bent condition. In other words, the upper surface $S_{11}$ of the elastomeric transparent substrate 10 may be stretched or extended while the lower surface $S_{12}$ may be compressed.

Figure 1C:
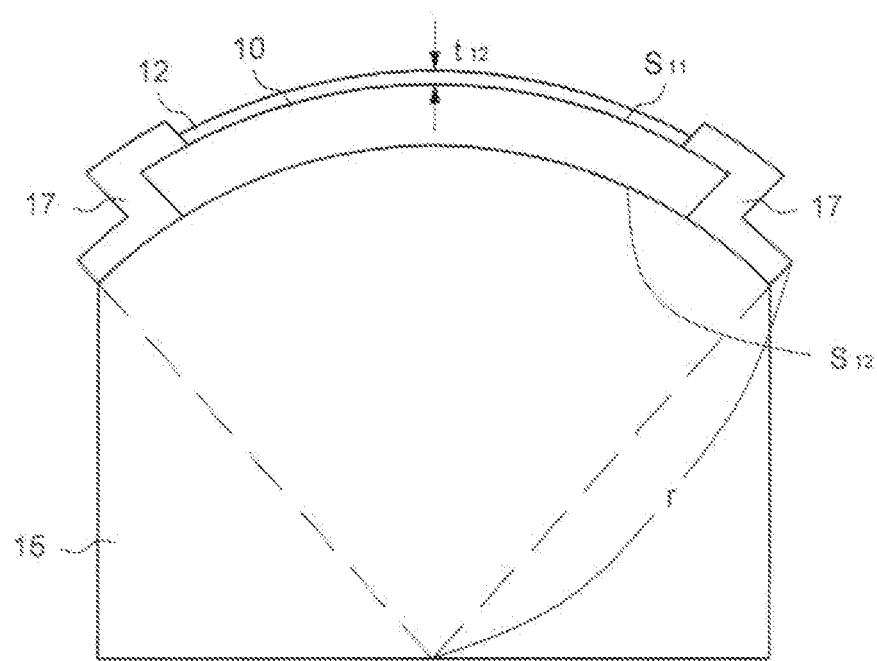

Next, as shown in FIG. 1C, the upper surface $S_{11}$ of the elastomeric transparent substrate 10 is sputtered with a light-penetrable thin film layer 12. Thickness $t_{12}$ of the light-penetrable thin film layer 12 is substantially so thin, such as 5 to 15 nm, that visible light or UV light could penetrate the light-penetrable thin film layer 12. In practice, the method of fabricating the light-penetrable thin film layer 12 may be through plasma sputtering deposition, RF sputtering deposition, dual cathodes sputtering deposition, magnetron sputtering deposition, or ion beam sputtering deposition. The material of the light-penetrable thin film layer 12 may be a metal or a non-metal thin film. The Young's modulus of the light-penetrable thin film layer 12 may be larger than the Young's modulus of the elastomeric transparent substrate 10, meaning the tensile strain of the light-penetrable thin film layer 12 is smaller than the tensile strain of the elastomeric transparent substrate 10. In an embodiment, the light-penetrable thin film layer 12 is metal thin film and the Young's modulus of the light-penetrable thin film layer 12 may be about 80 to 120 GPa such as gold (Au) or silver (Ag) thin film, or about 120 to 180 GPa, such as platinum (Pt) or alloy with the lower elasticity. In alternative embodiment, the light-penetrable thin film layer 12 is a non-metal thin film and the Young's modulus of the light-penetrable thin film layer 12 may be about 90 to 150 GPa, such as silicon dioxide or aluminum oxide thin film.

In an embodiment, the upper surface $S_{11}$ of the elastomeric transparent substrate 10 may be treated with a surface treatment to form the light-penetrable thin film layer 12, replacing the sputtering deposition. In other words, the light-penetrable thin film layer 12 may be formed from the elastomeric transparent substrate 10 itself. For example, the surface treatment may be a chemical liquid process or an oxygen plasma treatment to oxidize the light-penetrable thin film layer 10. In practice, the chemical liquid may be sulfuric acid ($H_2SO_4$), nitric acid ($HNO_3$), etc.

The sequence of the procedure of the present invention is not restricted by the above-mentioned embodiment. In practice, the elastomeric transparent substrate 10 may be also bent after the light-penetrable thin film layer 12 is sputtering deposited on the elastomeric transparent substrate 10. Further, the method of bending the elastomeric transparent substrate 10 is not restricted by the stage device 15. The force may be applied to the opposite ends of the elastomeric transparent substrate 10. In particular, the applied force may not exceed the limit of elasticity of the elastomeric transparent substrate 10 and the light-penetrable thin film layer 12.

Figure 1D:
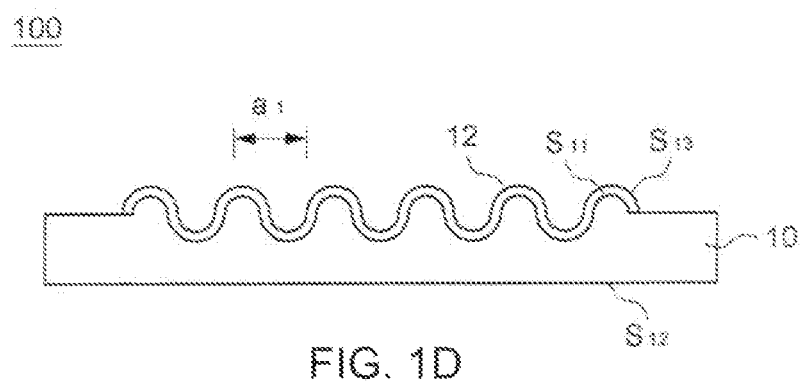

Referring to FIG. 1D, a wave-shaped mask 100 is shown after the elastomeric transparent substrate 10 is released from the stage device 15 and placed on a plane surface. At this time, the elastomeric transparent substrate 10 is free from the external force and then the deformations of the elastomeric transparent substrate 10 and the light-penetrable thin film layer 12 may recover, respectively. Since the Young's modulus of the elastomeric transparent substrate 10 is different from the Young's modulus of the light-penetrable thin film layer 12, the restoring forces or the shrinking rates of them are not the same which results in the upper surface $S_{11}$ of the elastomeric transparent substrate 10 and the light-penetrable thin film layer 12 shrinking spontaneously and becoming a wave-shaped mask 100. Specifically, the upper surface $S_{13}$ of the wave-shaped mask 100 (i.e. the upper surface of the light-penetrable thin film layer 12) is in period-wave shape, where period $a_1$ is about 300 to 1000 nm.

Accordingly, by choosing various materials, forming various thickness $t_{12}$ of the light-penetrable thin film layer 12 and adjusting the radius of curvature r of the stage device 15, different periods $a_1$ of the wave-shaped mask 100 may be obtained. In general, the thinner the thickness $t_{12}$ of the light-penetrable thin film layer 12, the smaller the period $a_1$ of the wave-shaped mask 100.

Figure 2A:
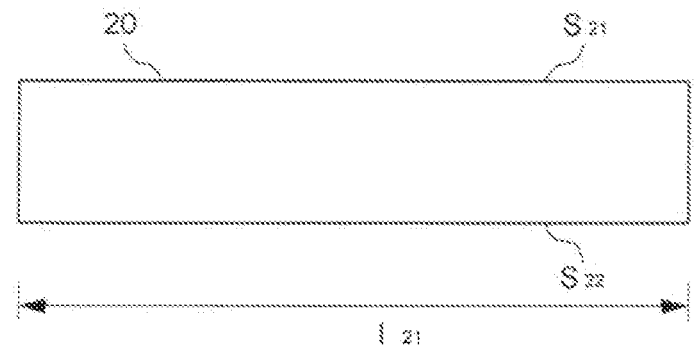
FIGS. 2A through 2D are cross sectional views illustrating the steps for fabricating a wave-shaped mask, in accordance with an embodiment of the present disclosure.
Figure 2B:
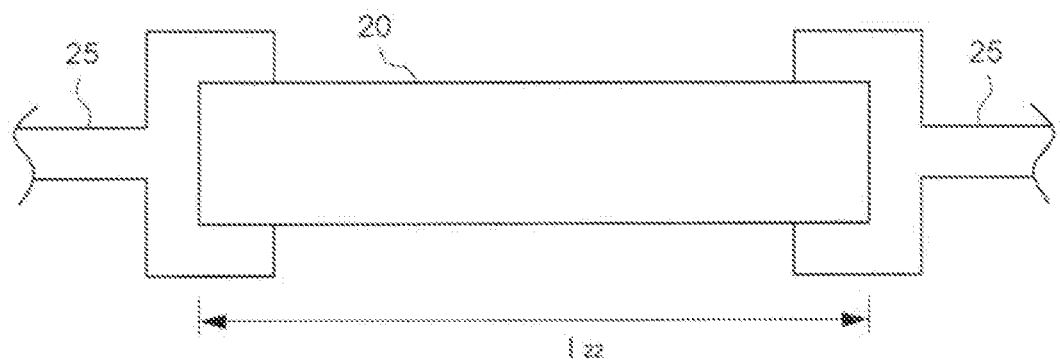
Figure 2C:
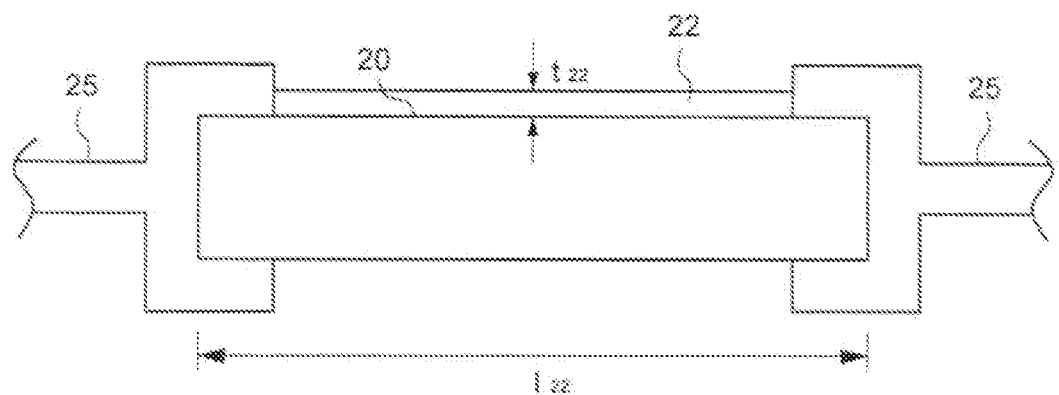
Figure 2D:
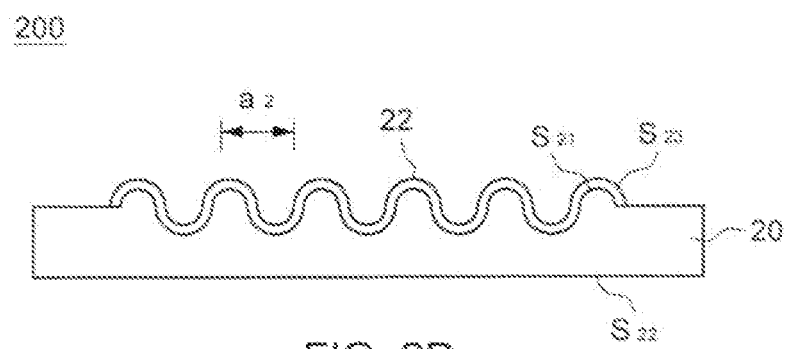

FIGS. 2A through 2D are cross sectional views illustrating the steps for fabricating a wave-shaped mask. A wave-shaped mask 200, as shown in FIG. 2D, is generally the same as the wave-shaped mask 100, as shown in FIG. 1D. A light-penetrable thin film layer 22 is formed on an elastomeric transparent substrate 20. The difference is that before the light-penetrable thin film layer 22 is formed, two opposite ends of the elastomeric transparent substrate 20 are clamped by a fixed device 25. The fixed device 25 may be a part of the machine which is driven to generate two opposite forces along the horizontal axis parallel to the elastomeric transparent substrate 20 for extending or pressing the elastomeric transparent substrate 20. For example, the fixed device 25 may stretch or press the elastomeric transparent substrate 20 along the long side of the elastomeric transparent substrate 20 such that the length of the elastomeric transparent substrate 20 is extended or shortened from $l_{21}$ to $l_{22}$, as shown between FIGS. 2A and 2B.

When the fixed device 25 releases the elastomeric transparent substrate 20, upper surface $S_{21}$ of the elastomeric transparent substrate 20 and the light-penetrable thin film layer 22 shrink spontaneously and become a wave-shaped mask 200. Specifically, the upper surface $S_{23}$ of the wave-shaped mask 200 is in period-wave shape after the fixed device 25 releases the elastomeric transparent substrate 20.

Based on the above-mentioned method, various thicknesses $t_{22}$ of the light-penetrable thin film layer 22 may be made of different materials, and various periods $a_2$ of the wave-shaped mask 200 may be made by adjusting the force applied to the elastomeric transparent substrate 20 from the fixed device 25.

Next, the present disclosure may describe the exposure method of fabricating nano-period structure by using the wave-shaped mask 100 or the mask-shaped mask 200. It is worthy to notice that, the exposure method adopts the traditional photolithography method, hence the difference from it may be described hereinafter while the other may be unnecessary to go into details.

Figure 3A:
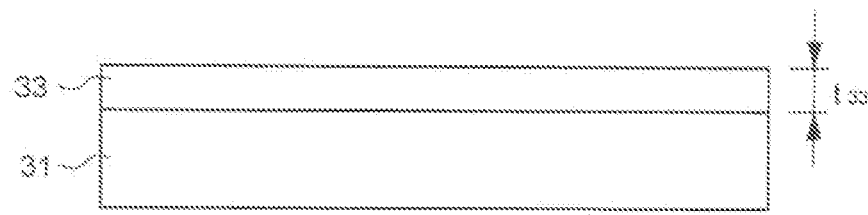
FIGS. 3A through 3D are cross sectional views illustrating the exposing steps for fabricating a nano-period structure by using the wave-shaped mask, in accordance with an embodiment of the present disclosure.

FIGS. 3A through 3D are cross sectional views illustrating the exposing steps for fabricating a nano-period structure by using the wave-shaped mask. First, a sample substrate 31 is provided as shown in FIG. 3A. The upper surface of the sample substrate 31 is coated with a photoresist layer 33 which may be positive photoresist or negative photoresist. Thickness $t_{33}$ of the photoresist layer 33 may be approximately 900 to 1200 nm.

Figure 3B:
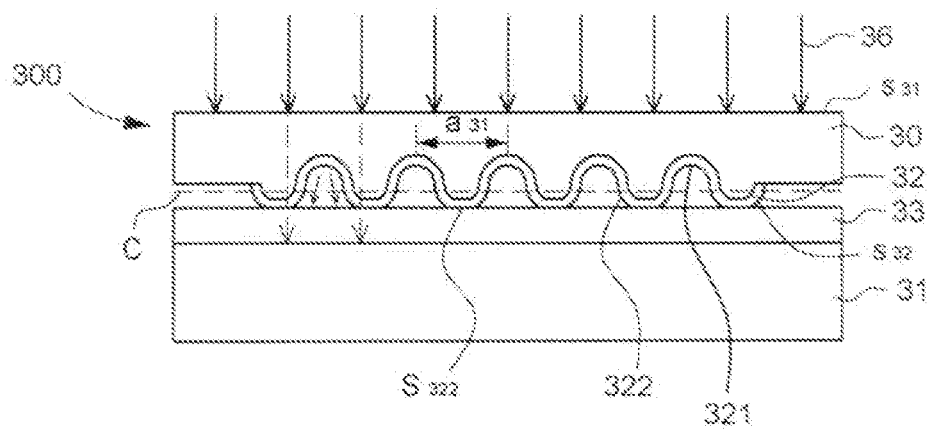

Next, a wave-shaped surface $S_{32}$ with period $a_{31}$ of a wave-shaped mask 300 is placed in contact and aligned with the photoresist layer 33, as shown in FIG. 3B. A light-penetrable thin film layer 32 of the wave-shaped mask 300 is directly in contact with the photoresist layer 33. Since a elastomeric transparent substrate 30 of the wave-shaped mask 300 is an elastomer, the contact surface of the light-penetrable thin film layer 32 tends to be a smooth plate when the wave-shaped mask 300 is in contact with the photoresist layer 33. Specifically, if looking at a cross section of the light-penetrable thin film layer 32, the portion above an axis c is regarded as a concave 321, and the portion below the axis c is regarded as a convex 322, and the part of the convex 322 is smoothed to be a smooth plate $S_{322}$.

Plate-shaped surface $S_{31}$ of the wave-shape mask 300 is exposed to a light source 36 after the wave-shaped mask 300 is aligned and in contact with the photoresist layer 33. The light source 36 may be UV light or visible light. When the light source 36 passes through the wave-shaped mask 300, the part of light may pass through the smooth plate $S_{322}$ without reflection, and the other part of the light may be scattered from the concave 321. In other words, the concave 321 of the wave-shaped mask 300 may be regarded as a concave lens, therefore, the light intensity passing through the concave 321 is less than the light intensity passing through the smooth plate $S_{322}$ of the convex 322 to change the bonding strength of the photoresist layer 33. It is worthy to notice that, the comparison between the light intensity from the concave 321 and the light intensity from the convex 322 would be enhanced by increasing the amplitude on wave-shaped surface $S_{32}$ of the light-penetrable thin film layer 32 to improve the exposure efficiency.

Figure 3C:
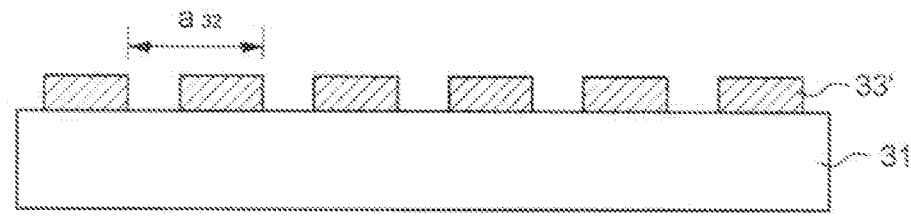
Figure 3D:
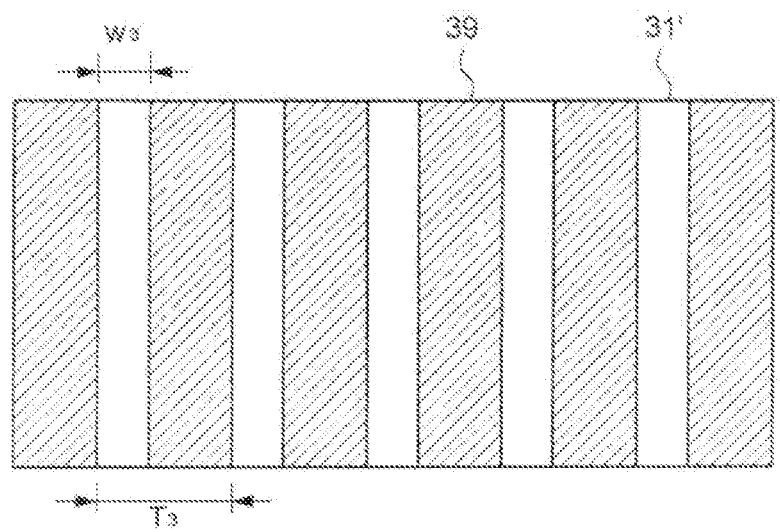

After exposure and development processes, a photoresist layer 33' is patterned to be a nano-period structure pattern with period $a_{32}$, as shown in FIG. 3C. In one embodiment, a period $a_{32}$ of the photoresist layer 33' is similar to the period $a_{31}$ of the wave-shaped mask 300. After the etching process, the substrate 33' with a nano-period structure 39 is obtained, as shown in FIG. 3D. A period $T_3$ of the nano-period structure 39 may be similar to the period $a_{32}$ of the patterned photoresist layer 33', such as 300 to 1000 nm, and the critical dimension may be about 300 to 400 nm.

FIGS. 4A through 4D are cross sectional views illustrating the exposing steps for fabricating a nano-period structure by using the wave-shaped mask. The exposing method of this embodiment is generally the same with the exposing method shown in FIGS. 3A to 3D. A light-penetrable thin film layer 42 of a wave-shaped mask 400 is also placed in contact with a photoresist layer 43 disposed on a sample substrate 41. The difference between them is that after exposure to a light source 46 for the first time, an external force F is applied to the wave-shaped mask 400. In one embodiment, the external force F may be two opposite forces along the horizontal axis of the wave-shaped mask 400 from the machine for extending or pressing the wave-shaped mask 400. Accordingly, a period $a_{41}$ of the light-penetrable thin film layer 42 disposed on the elastomeric transparent substrate 40 is adjustable. After extending or pressing the wave-shaped mask 400, by repeating at least one exposure process, the nano-period structure pattern with the period $a_{42}$ of the photoresist layer 43' may be obtained. Therefore, a period $a_{42}$ of the nano-period structure is adjustable by using the above-mentioned exposing method.

In an alternative embodiment, in addition to applying the external force F, the wave-shaped mask 400 may also be shifted in a predetermined distance or rotated by a predetermined degree by the fixed device of the machine. In one embodiment, the rotating degree is between 0 and 360 degrees. After shifting or rotating, the various nano-period structures are obtained as shown in FIGS. 4D-(a) through (e) by repeating the exposure process.

Figure 4A:
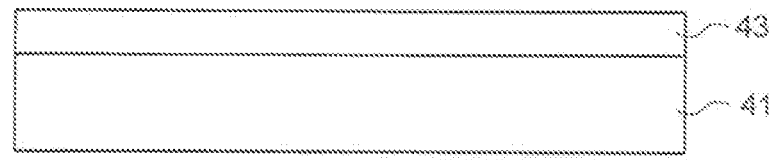
FIGS. 4A through 4D are cross sectional views illustrating the exposing steps for fabricating a nano-period structure by using the wave-shaped mask, in accordance with an embodiment of the present disclosure.
Figure 4:
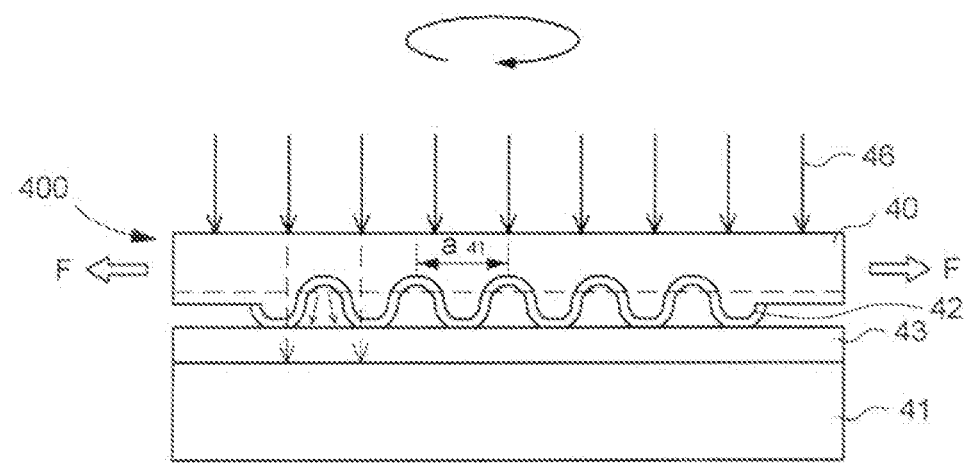
Figure 4C:
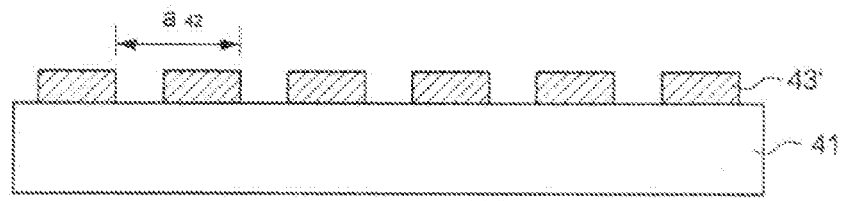
Figure 4D:
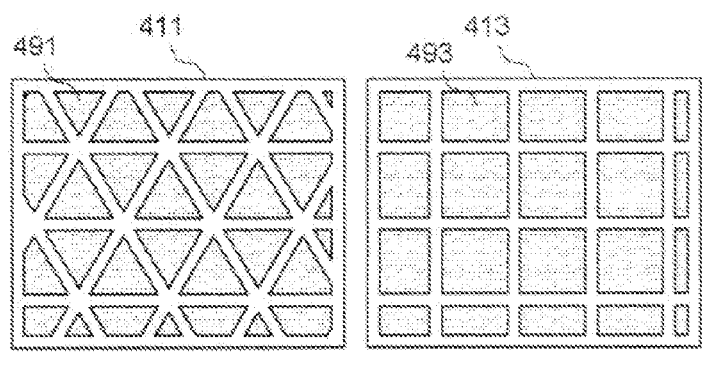

A substrate 411 in FIG. 4D-(a) having a nano-scaled structure 491 with periodic triangles is obtained by the primary exposure process via the wave-shaped mask 400 and repeating a secondary exposure process after rotating the wave-shaped mask 400 by 60 degrees twice. A substrate 413 in FIG. 4D-(b) having a nano-scaled structure 493 with periodic squares is obtained by the primary exposure process via the wave-shaped mask 400 and repeating a secondary exposure process after rotating the wave-shaped mask 400 by 90 degrees once. A substrate 415 in FIG. 4D-(c) having a nano-scaled structure 495 with periodic rectangles is obtained by the primary exposure process via the wave-shaped mask 400 and repeating a secondary exposure process after extending the wave-shaped mask 400 and rotating the wave-shaped mask 400 by 90 degrees once. As shown in FIGS. 4D-(d) and (e), both a substrate 417 having a nano-scaled structure 497 with periodic rhombuses and a substrate 419 having a nano-scaled structure 499 with period parallelograms are obtained by the primary exposure process via the wave-shaped mask 400 and repeating the secondary exposure process after rotating the wave-shaped mask 400 by a predetermined degree not equal to 90 degrees. Further, the wave-shaped mask 400 is stretched or pressed before the secondary exposure process in the fabrication process of the substrate 419. The patterns of the periodic nano-scaled structure are not restricted by above-mentioned examples.

Overall, the present disclosure describes using two materials with different compression coefficients as a transparent mask for photolithography directly rather than removing metal or other material. In particularly, various nano-scaled structures with different periods, contours, and sizes are obtained via the same wave-shaped mask after some processes. Thereby, the present disclosure may simplify complex photolithography procedures and reduce the manufacturing costs and times. Additionally, a large area of nano-structure pattern may be mass produced for using of optoelectronic industry and biomedical industry.

Realizations in accordance with the present invention have been described in the context of particular embodiments. These embodiments are meant to be illustrative and not limiting. Many variations, modifications, additions, and improvements are possible. Accordingly, plural instances may be provided for components described herein as a single instance. Structures and functionality presented as discrete components in the exemplary configurations may be implemented as a combined structure or component. These and other variations, modifications, additions, and improvements may fall within the scope of the invention as defined in the claims that follow.

What is claimed is:

1. A method of fabricating a wave-shaped mask for photolithography, the method comprising:
    providing an elastomeric transparent substrate, wherein the elastomeric transparent substrate comprises an upper surface and a lower surface;
    applying a force to the elastomeric transparent substrate, wherein applying the force comprises deforming the elastomeric transparent substrate;
    forming a light-penetrable thin film layer on the upper surface of the elastomeric transparent substrate; and
    removing the force applied to the elastomeric transparent substrate, wherein removing the force shrinks the upper surface of the elastomeric transparent substrate and the light-penetrable thin film layer into a periodic wave shape while the lower surface of the elastomeric transparent substrate remains in a plate shape.

2. The method according to claim 1, wherein the elastomeric transparent substrate comprises Polydimethylsiloxane or Polyimide.

3. The method according to claim 1, wherein the elastomeric transparent substrate is a transparent polymeric elastomer.

4. The method according to claim 1, wherein applying the force to the elastomeric transparent substrate comprises bending the elastomeric transparent substrate into an arc shape.

5. The wave-shaped mask according to claim 4, wherein bending the elastomeric transparent substrate comprises fixing the elastomeric transparent substrate on a stage device with an arc-shaped edge.

6. The method according to claim 1, wherein applying the force to the elastomeric transparent substrate comprises stretching the elastomeric transparent substrate along a horizontal axis.

7. The method according to claim 1, wherein forming the light-penetrable thin film layer comprises sputtering a metal thin film on the upper surface of the elastomeric transparent substrate.

8. The method according to claim 7, wherein the metal thin film comprises Au or Ag.

9. The method according to claim 7, wherein the metal thin film has a Young's modulus between 80 to 180 GPa.

10. The method according to claim 1, wherein forming the light-penetrable thin film layer comprises forming an oxide thin film on the upper surface of the elastomeric transparent substrate.

11. The method according to claim 10, wherein the oxide thin film comprises silicon dioxide or aluminum oxide.

12. The method according to claim 10, wherein the oxide thin film has a Young's modulus between 90 and 150 GPa.

13. The method according to claim 1, wherein forming the light-penetrable thin film layer comprises performing surface treatment to the upper surface of the elastomeric transparent substrate to oxidize the upper surface.

14. The method according to claim 13, wherein the surface treatment comprises a chemical liquid process or an oxygen plasma treatment.

* * * * *